US010206258B2

(12) United States Patent
Cala' et al.

(10) Patent No.: US 10,206,258 B2
(45) Date of Patent: Feb. 12, 2019

(54) PULSE WIDTH MODULATION PATTERN GENERATOR CIRCUIT, CORRESPONDING DEVICE AND METHOD

(71) Applicant: STMicroelectronics S.r.l., Agrate Brianza (IT)

(72) Inventors: Ignazio Cala', Syracuse (IT); Santi Carlo Adamo, Aci Castello (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 15/975,059

(22) Filed: May 9, 2018

(65) Prior Publication Data
US 2018/0368227 A1 Dec. 20, 2018

(30) Foreign Application Priority Data

Jun. 16, 2017 (IT) .................... 102017000067192

(51) Int. Cl.
H05B 33/08 (2006.01)
H03K 7/08 (2006.01)

(52) U.S. Cl.
CPC .......... *H05B 33/0845* (2013.01); *H03K 7/08* (2013.01); *H05B 33/0815* (2013.01)

(58) Field of Classification Search
CPC ... H05B 33/0845; H05B 33/0815; H03K 7/08
USPC ........................................................ 315/250
See application file for complete search history.

(56) References Cited

U.S. PATENT DOCUMENTS

| 6,182,235 B1 | 1/2001 | Ma et al. | |
| 7,376,182 B2 * | 5/2008 | Kris | H03K 7/08 341/53 |
| 2002/0190768 A1 * | 12/2002 | Bowling | H03K 7/08 327/175 |
| 2006/0120080 A1 | 6/2006 | Sipinski et al. | |

(Continued)

FOREIGN PATENT DOCUMENTS

WO   2006023427 A2   3/2006

OTHER PUBLICATIONS

Texas Instruments, "DRV2625 Ultra Low Power Closed-Loop LRA/ERM Haptic Drive with Built-in Library," SLOS879B, Apr. 2017—Revised Sep. 2016, 77 pages.

*Primary Examiner* — Daniel D Chang
(74) *Attorney, Agent, or Firm* — Slater Matsil, LLP

(57) ABSTRACT

A circuit includes: a plurality of memory locations configured to store pulse width modulation (PWM) signal generation data, the memory locations being arranged in N sets of memory locations, each including i channel memory locations, each channel memory location being configured to store a respective duty-cycle value for a respective one of N PWM modulation patterns; a selection circuit configured to selectively access a selected set of the sets of memory locations; a buffer circuit configured to store the PWM signal generation data from the channel memory locations of the selected set; and a finite state machine configured to receive PWM signal generation input data indicative of a plurality of PWM modulation patterns with a respective plurality of duty-cycle values, the finite state machine configured to activate the selection circuit to load the PWM signal generation data from the channel memory locations of the selected set to the buffer circuit.

20 Claims, 3 Drawing Sheets

(56) References Cited

U.S. PATENT DOCUMENTS

2010/0156317 A1* 6/2010 Arai .................. G09G 3/342
315/294

* cited by examiner

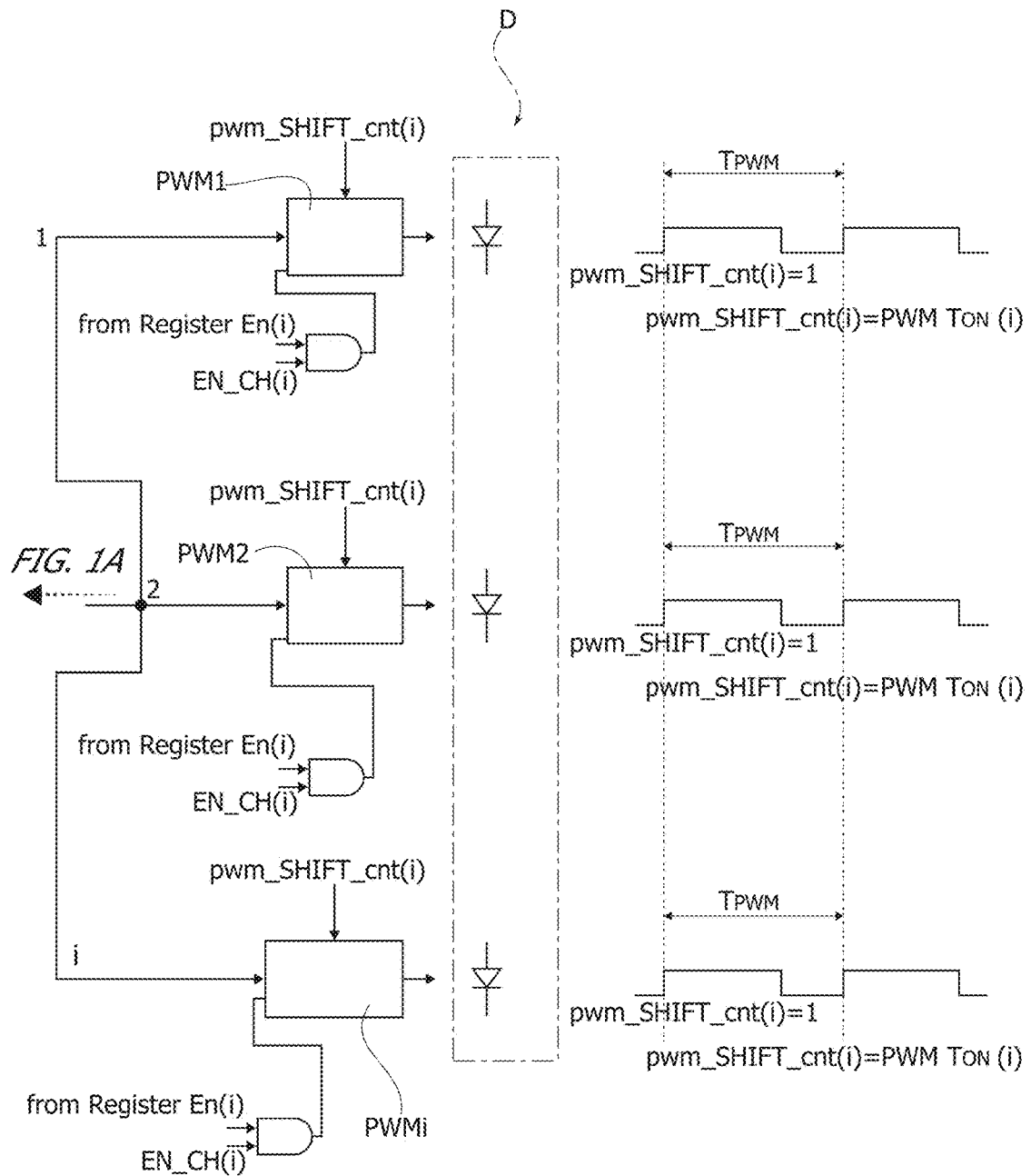

PULSE WIDTH MODULATION PATTERN GENERATOR CIRCUIT, CORRESPONDING DEVICE AND METHOD

CROSS-REFERENCE TO RELATED APPLICATIONS

This application claims priority to Italian Application No. 102017000067192, filed on Jun. 16, 2017, which application is hereby incorporated herein by reference.

TECHNICAL FIELD

The present invention relates generally to an electronic circuit, and, in particular embodiments, to a pulse width modulation (PWM) pattern generator circuit, corresponding device and method.

BACKGROUND

PWM generator circuits, such as integrated circuits for use as LED driver units (e.g., in display screens) may involve a continuous intervention of an external control unit (e.g., a microcontroller) in order to be able to change continuously and dynamically the parameters of the PWM signals. This may be the case of e.g., the duty-cycle, which is the ratio between the time Ton the signal is "on" and the period Ton+Toff of the PWM signal, for each LED channel.

This continuous intervention may result in controller resources and time being devoted to various activities such as e.g., interrupt service routine execution, flag polling, internal timer usage for controlling the time a certain LED channel is intended to be configured with a certain duty-cycle and how long a different duty-cycle may be desired, and so on.

SUMMARY

Some embodiments provide circuits where controller intervention is not involved. One or more embodiments may be applied, for instance, in integrated circuits (ICs) for use as LED drivers.

One or more embodiments may refer to a corresponding device and to a corresponding method.

One or more embodiments may provide an architecture for e.g., an integrated circuit for use as a LED driver capable of generating a number N of PWM pattern sequences over a number i of output channels.

One or more embodiments facilitate reducing the intervention of a controller unit e.g., in a LED driver arrangement, so that controller resources may be made available for other tasks including real-time tasks.

One or more embodiments may permit to specify a PWM duty-cycle for each one of a number of output channels, a corresponding pattern duration and how many times a certain sequence is desired to be repeated.

One or more embodiments make it possible to specify a programmable shift between a certain channel and a subsequent channel.

One or more embodiments may facilitate obtaining smooth changes in channel waveforms between a certain channel and a subsequent one, thus facilitating avoiding abrupt transitions in PWM channels.

One or more embodiments may be applied to integrated circuit for use as LED drivers, e.g., in arrangements where a controller unit such as a microcontroller may program LED driver registers e.g., via a serial interface.

One or more embodiments facilitate limiting the intervention of a controller unit to programming duty-cycle values desired for a certain channel i and for a certain pattern N, possibly along with the duration of a single pattern N, a shift time and how many times a certain pattern sequence is desired to be repeated (e.g., from one to an infinite loop). A controller unit used in cooperation with one or more embodiments may thus simply start a certain pattern sequence and then transition to executing other control/processing tasks such as real-time tasks.

One or more embodiments may provide the capability of setting a PWM duty-cycle (Ton) value for each channel in a pattern, while also possibly setting the duration time of each pattern (e.g., if 0, the corresponding pattern may be skipped), the repetition time of a whole pattern sequence (which may take the form of an infinite loop), and a shift between PWM waveforms while also facilitating an accurate internal synchronization.

One or more embodiments may rely on a finite state machine, which may facilitate synchronized smooth changes in the sequence parameters, with the capability of avoiding discontinuities ("cuts") in the output PWM waveforms. In use for driving LEDs, these may cause undesired flickering in LED emission.

One or more embodiments may provide for a single internal buffering (for a single pattern) with changes (e.g., from pattern to a next one) managed by the finite state machine. This facilitates smooth changes in PWM waveforms without discontinuities (no flickering in driven LEDs) while also facilitating reduction in silicon area (multiple buffering and handshake mechanisms can be avoided), while also reducing the involvement of an external (micro) controller.

BRIEF DESCRIPTION OF THE DRAWINGS

One or more embodiments will now be described, by way of example only, with reference to the annexed figures, wherein:

FIGS. 1A and 1B show a block diagram, split into two parts for clarity of presentation, exemplary of embodiments, FIG. 2 is exemplary of PWM signal generation.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1A:
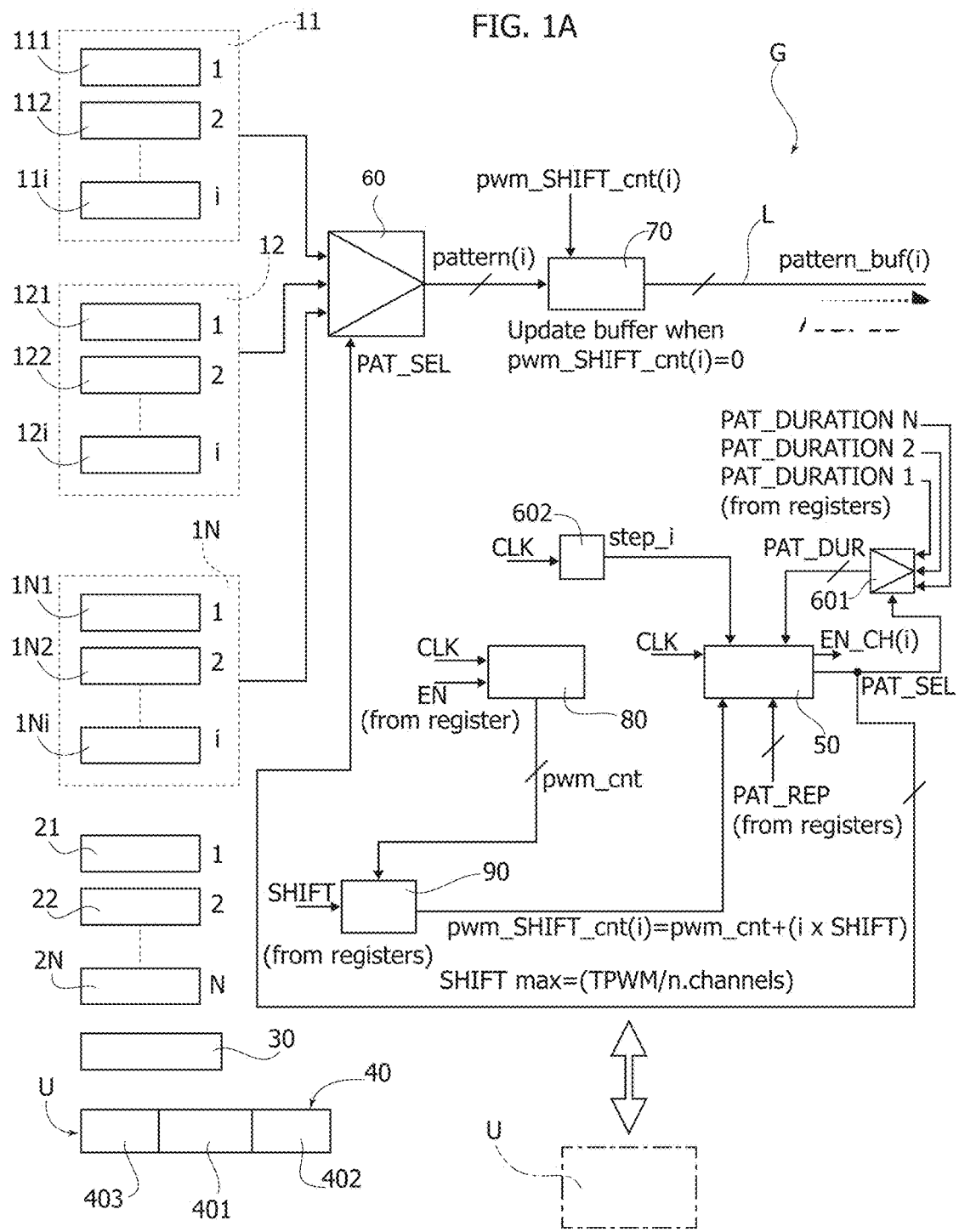

In FIG. 1A, reference G indicates a PWM pattern generation circuit, which, in one or more embodiments, may cooperate with a set or bank of PWM generators PWM1, PWM2, ..., PWMi as shown in FIG. 1B for generating PWM-modulated signals.

In one or more embodiments, such PWM modulated signals (as exemplified in FIG. 2) may include drive signals for LEDs as included e.g., in a unit D such as a display screen in an electronic device (not visible in the drawings as a whole).

In one or more embodiments, the PWM generators PWM1, PWM2, ..., PWMi can be incorporated in a single integrated circuit with the generator G and generate respective PWM signals. For instance the PWM generators PWM1, PWM2, ..., PWMi can include comparators active on an internal signal pwm_SHIFT_cnt(i), so that e.g., the output signals from the PWM generators go "high" as a result of pwm_SHIFT_cnt(i)=1 and go "low" as a result of pwm_SHIFT_cnt(i)=PWM TON(i).

In one or more embodiments, the circuit G may include a number of memory locations, as exemplified in FIG. 1A.

In one or more embodiments the memory locations arranged in N "pattern" sets 11, ..., 1N with each set including a number i of "channel" memory locations (e.g., registers) 111, 112, ..., 11i; 121, 122, ... 12i; ...; 1N1, 1N2, ..., 1Ni. The memory locations discussed above may thus correspond to a number N of sets each including i channels, each in turn including j bits (for instance j=12).

The memory locations discussed may thus store—for each of N (different) patterns—data indicative of respective duty-cycle values PWM Ton(i) (j-bit wide, with e.g., j=12) for a generic channel i of an output signal to be sent towards a respective one PWM generator of the PWM generators PWM1, PWM2, ..., PWMi.

Reference numbers 21, 22, ..., 2N designate N further (k-bit wide, with e.g., k=8) "pattern duration" memory locations which may store data indicative of duration values associated with each one of the N patterns (e.g., a multiple of 20 ms: this is of course a purely exemplary, non-limiting value).

In one or more embodiments as exemplified herein, if pattern duration is programmed to "o", then a relative pattern is skipped in the sequence.

A further "pattern repetition" memory location 30 (e.g., 8-bit wide) may be provided in order to store data indicative of how many times a certain pattern sequence is desired to be repeated by the generator G, e.g., from 1 to "infinite times".

In one or more embodiments, a further set of memory locations 40 may be provided including three memory locations 401, 402, 403.

The location 401 as exemplified includes a "shift" memory location 401 (m-bit wide, with e.g., m=9) for storing data indicative of a SHIFT time between one channel and a subsequent channel in a sequence.

For instance, an arrangement as disclosed herein may have a PWM period TPWM of 4096 microseconds: in that case the shift time can be programmed from 0 to TPWM(i) (shift max) where i is the channel number (e.g., i=12) which (with reference to the quantity of data provided herein) may vary from 0 to 341 microseconds (e.g. obtained by the division of the PWM period with the number of channels).

The location 402 as exemplified may store an enable signal EN which may be used to start operation of the generator G, and, possibly, other internal voltage references and other known circuits not visible in the drawings.

The location 403 as exemplified may be provided to store an automatic pattern sequence start signal PATSR so that, once a control unit U (e.g., a microcontroller) which supervises operation of the circuit G has started the sequence generation (e.g., by loading data into various memory locations as discussed previously), PWM signal generation may be managed by the generator G e.g., by means of a finite state machine (FSM) 50 as discussed in the following. This facilitates reducing involvement of the unit U (a distinct element from the circuit G of one or more embodiments), which may thus devote its resources and time to other tasks such as e.g., real-time tasks.

Again it will be noted that quantitative data (e.g., number of bits in memory locations, time values and so on) presented throughout this description are provided merely by way of example and are not intended to limit the scope of embodiments.

In one or more embodiments, the finite state machine 50 may provide a pattern selection signal PAT_SEL to a multiplexer 601 so that one of the sets 11, 12, ..., 1N corresponding to a desired PWM modulation pattern is selected and duty-cycle data read from the corresponding memory locations are fed as a pattern(i) signal to a PWM buffer 70.

The PWM buffer 70 is configured to output a corresponding "pattern" signal pattern_buf(i) towards the PWM generators PWM1, PWM3, ..., PWMi (see FIG. 1B), which also receive respective "channel" enable signals EN_CH(i) from the finite state machine 50.

In embodiments as exemplified herein, the enable signals EN_CH(i) are fed to the PWM generators PWM1, PWM2, ..., PWMi after gating (e.g., via AND gates) with a general enable signal EN(i), e.g., from a memory location in 40.

In embodiments as exemplified herein, the PWM generators PWM1, PWM3, ..., PWMi also receive a shifted counter signal pwm_SHIFT_cnt(i) corresponding to the value stored at 401 multiplied by i+pwm_cnt(i), where pwm_cnt(i) is the output from 80), that is, pwm_SHIFT_cnt(i)=pwm_cnt+(i×SHIFT).

As discussed in the following, the PWM buffer 70 may be sensitive to the shifted counter signal pwm_SHIFT_cnt(i) to possibly update the buffer.

The counter 80, which receives the enable signal EN (from 402), co-operates with the finite state machine 50 via a shift buffer 90 which receives the SHIFT signal (from 401).

Operation of the finite state machine 50 and the counter 80 is timed by a clock signal CLK (from a generator not visible in the figures).

Reference 610 indicates a further multiplexer configured for inputting to the finite state machine 50 a pattern duration signal PAT_DUR which is selected under the control of the PAT_SEL signal out of N possible values PAT_DURATION 1, PAT_DURATION 2, ..., PAT_DURATION N.

The clock signal CLK is also fed to a clock signal divider 602 coupled with the finite state machine 50 to supply thereto a (frequency) divided clock signal step_i.

The output signal PAT_SEL from the Finite State Machine 50 is also sent to the further multiplexer 601 to select the pattern duration signal PAT_DUR to be fed to the finite state machine 50 out of PAT_DURATION 1, ..., PAT_DURATION N for the various patterns.

Possible operation of one or more embodiments will now be described by way of example with reference to the graph of FIG. 3 and the circuit layout exemplified in FIG. 1A (and FIG. 1B).

Figure 3:
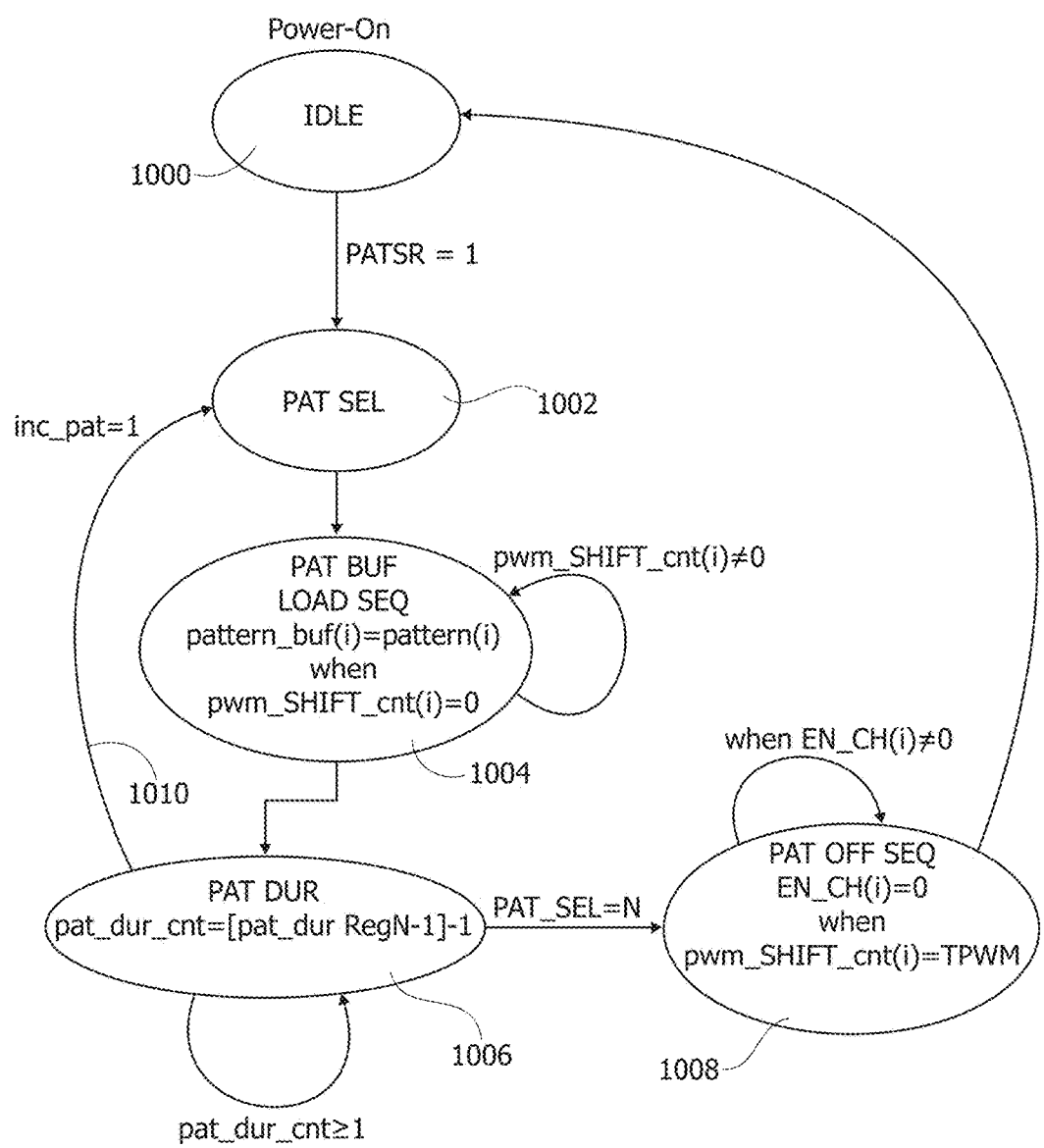
FIG. 3 is a graph exemplary of possible operation of one or more embodiments.

The graph of FIG. 3 is exemplary of possible operation of the finite state machine 50. Again, it will be assumed that, once the control unit U (e.g., a microcontroller) has started e.g., by programming PATSR bit the sequence generation process (e.g., by loading data into various memory locations as discussed previously), PWM signal generation may be managed in the generator G e.g., by means of the finite state machine 50, so that the controller unit U may devote its resources and time to other tasks such as e.g., real-time tasks.

Referring primarily to FIG. 3 (and to FIG. 1A, where the memory locations on the right-hand side include the Registers from which various signals are sourced as indicated), at Power-On the microcontroller (controller unit U) sets the PATSR bit (at 403), so that the finite state machine 50 goes from an IDLE state 1000 to a pattern selection (PAT_SEL) state 1002 and set its output PAT_SEL to a value causing e.g., pattern 1 to be selected.

This signal goes to the pattern selection multiplexer 600 and to the pattern duration selection multiplexer 610 to select a current pattern and the current pattern duration time.

The finite state machine 50 then goes to a PAT BUF LOAD SEQ state 1004 so that in the PWM buffer block 70 an output signal pattern_buf is loaded by the finite state machine 50 with a pattern signal at different times when pwm_SHIFT_cnt(i)=0.

The signal pwm_SHIFT_cnt(i) is obtained from the PWM counter 80, via the SHIFT buffer circuit block 90. For instance, this may occur as follows: pwm_SHIFT_cnt(i)=pwm_cnt+ixSHIFT, where pwm_cnt is value of the PWM counter 80, i is the channel number and SHIFT is the content of the SHIFT memory location 401.

The PWM counter circuit block 80 may include a free running e.g., 12-bit counter enabled by an EN bit (location 402) and a PATSR bit (location 403) and configured for counting e.g., from 0 to 4095 based on the internal clock signal CLK, having e.g., a period of 1 microsecond.

As exemplified herein, the signal pattern_buf to the PWM generators (e.g. shown in FIG. 1B) may correspond to a memory location matrix having a number of rows equal to the number i of (output) channels and a number of columns equal to j, where j is the width of the duty-cycle signal PWM TON(i).

For instance, pattern_buf may contain duty-cycle values for each channel in the pattern selected by means of the signal PAT_SEL. These values can be stored by the finite state machine 50 at different times e.g., in order to facilitate a smooth transition for each channel between e.g., a duty cycle for a previous pattern and a duty-cycle for a current one.

These values can be sent to the generators PWM1, PWM2, . . . , PWMi for the various (e.g., LED) channels so that these generators can generate respective output PWM waveforms (see FIG. 2) when enabled (e.g., via input logic, such as an AND gate as shown) by a signal EN(i) and a signal EN_CH(i) signal.

In one or more embodiments as exemplified herein, the signal EN_CH(i) can be set by the finite state machine 50 when the pattern sequence is started (e.g., PATSR="1") and reset at different times when PWM_SHIFT_cnt(i)=TPWM in a state PAT OFF SEQ 1008 as discussed in the following.

For instance, the PWM waveform(s) at the output of the generators PWM1, PWM2, . . . , PWMi can be set when pwm_SHIFT_cnt(i)=1 and reset when pwm_SHIFT_cnt(i)=PWM TON(i).

In one or more embodiments as exemplified herein, once a current pattern is ongoing, the finite state machine 50 stays in a state PAT DUR 1006 as long as e.g., a signal pat_dur_cnt>=1.

Pat_dur_cnt is a k-bit (k=8) counter which can be set in the state PAT DUR 1006 to the value programmed in the corresponding pattern duration memory registers 21, 22, . . . , 2N according to a pattern selected via the signal PAT_SEL (for instance PAT_SEL[2:0] if the number of patterns is 8).

In one or more embodiments as exemplified herein, if the value for the pattern duration is set to 0, the finite state machine 50 will skip the pattern and go from the PAT DUR state 1006 goes directly back to the PAT SEL state 1002 after setting a signal inc_pat (see e.g., FIG. 3).

Otherwise, when in the PAT DUR state 1006, pat_dur_cnt is decremented by the finite state machine 50 at intervals of e.g., 20 milliseconds by means of the signal step_i signal generated by the clock divider circuit block 602.

When a count pat_dur_cnt expires, the selected pattern is finished and the finite state machine 50 can set the signal inc_pat signal going in the PAT SEL state 1002, by incrementing the signal PAT_SEL signal thus selecting a next pattern.

At the end of a pattern sequence, the finite state machine 50 may go from the PAT DUR state to 1006 to the PAT OFF state when PAT_SEL=N where N is the number of patterns.

In that state, all the output (e.g., LED) channels are switched off e.g., via the EN_CH(i) signals in different times because SHIFT is enabled, in order not to undesirably alter the PWM waveforms in the output (e.g., LED) channels.

The signals EN_CH(i) can be reset when pwm_SHIFT_cnt(i)=TPWM.

One or more embodiments as exemplified herein make it possible to program with an external control unit U (e.g., a microcontroller, here indicated as U) a PWM pattern sequence used for driving e.g., LEDs.

One or more embodiments make it possible to program the duration and repetition at the beginning of the sequence with the capability of handling through a circuit architecture as exemplified (including an internal finite state machine) pattern sequence generation and timing.

In that way the control unit U can be relieved from the activity of monitoring an updating continuously the pattern sequence thus making its resources available for other tasks.

In one or more embodiments a circuit (e.g., G) may include: (1) a plurality of memory locations loadable with PWM signal generation data, the memory locations arranged in N sets (e.g., 11, 12, . . . , 1N) of i memory locations (e.g., 111, 112, . . . , 11i; 121, 122, . . . , 12i; 1N1, 1N2, . . . , 1Ni) each, wherein the memory locations are loadable with one respective duty cycle value out of i duty-cycle values for one out of N PWM modulation patterns; (2) a selector circuit block (e.g., 60) coupled to the plurality of memory locations, the selector circuit block actuatable (e.g., PAT_SEL) to selectively access the N sets of memory locations; (3) a buffer circuit block (e.g., 70) coupled to the selector circuit block, the buffer circuit block loadable with PWM signal generation data from the memory locations in the sets selectively accessed by the selector circuit block; and (4) a finite state machine (e.g., 50) configured (e.g., at 40) to receive (e.g., form a microcontroller U) PWM signal generation input data indicative of a plurality of PWM modulation patterns with a respective plurality of duty-cycle values, the finite state machine coupled to the selector circuit block and configured to activate (e.g., PAT_SEL) the selector circuit block as a function of said PWM signal generation input data to load to the buffer circuit block PWM signal generation data from the memory locations selectively accessed by the selector circuit block, the PWM signal generation data (e.g., pattern_buf(i)) in the buffer circuit block being indicative of i duty-cycle values for one of said N PWM modulation patterns.

In one or more embodiments, the PWM signal generation data (e.g., pattern_buf(i)) in the buffer circuit block may be arranged as a memory location matrix having a first number of rows and a second number of columns, wherein one of said first and second numbers (e.g., the number of rows) may be equal to the number i of said duty-cycle values and the other of said first and second numbers (e.g., the number of columns) may be equal to j, where j is the width of said duty-cycle values (in one or more embodiments the roles of rows and columns can be reversed).

In one or more embodiments the circuit may include further memory locations (e.g., 21, 22, . . . , 2N) each coupled to one of said N sets and loadable with data indicative of the duration of a respective one of said N PWM modulation patterns. In one or more embodiments, the finite state machine may be sensitive to PWM signal generation input data including data (e.g., PAT_DURATION 1, PAT_DURATION 2, . . . , PAT_DURATION N) indicative of respective durations for said N PWM modulation patterns. In one or more embodiments, the circuit may include a further selector circuit block (e.g., 601) coupled to the further memory locations and the finite state machine, the finite state machine configured to activate the further selector circuit block to select (e.g., PAT_SEL, PAT_DUR) respective durations for the PWM signal generation data for said N PWM modulation patterns in the buffer circuit block.

In one or more embodiments, the finite state machine (50) may be sensitive to data indicative of the duration of a certain PWM modulation pattern being set to zero and configured for skipping said certain PWM pattern.

In one or more embodiments the circuit may include a pattern repetition storage location (e.g., 30) loadable with repetition data indicative of the number of repetitions of a certain sequence of said N PWM modulation patterns. In one or more embodiments, the finite state machine (50) may be sensitive to repetition data loaded in said pattern repetition storage location and configured to discontinue repetition of a sequence of said PWM modulation patterns as a result of an upper repetition threshold value being reached.

In one or more embodiments the circuit may include a shift storage location (e.g., 401) loadable with shift data indicative of a time shift value (e.g., SHIFT) applicable between subsequent channels in said N PWM modulation patterns. In one or more embodiments, the finite state machine is sensitive (e.g., 90) to the time shift value loaded in the shift storage location and configured to provide a time shift between the PWM signal generation data for subsequent PWM modulation channels in said N PWM modulation patterns in the buffer circuit block.

One or more embodiments may include a plurality of PWM signal generators (e.g., PWM1, PWM2, . . . , PWMi) activatable to generate PWM modulated signals as a function of the PWM signal generation data in the buffer circuit block.

A device according to one or more embodiments may include: a circuit according to one or more embodiments, and a user unit (e.g., D) including a plurality of user channels coupled with respective PWM generators in the plurality of PWM generators, the user channels driven by the PWM signals generated thereby.

In one or more embodiments, the user unit may include light emitting diodes arranged in said plurality of user channels.

One or more embodiments may further include a controller unit (e.g., a microcontroller U) configured for providing said PWM signal generation input data to the finite state machine.

In one or more embodiments a method may include: (1) providing a plurality of memory locations with PWM signal generation data, the memory locations arranged in N sets of i memory locations (each); (2) loading the memory locations with one respective duty cycle value out of i duty-cycle values for one out of N PWM modulation patterns; (3) selectively accessing the N sets of memory locations, and loading to a buffer circuit block PWM signal generation data from the memory locations in the sets selectively accessed; (4) receiving at a finite state machine PWM signal generation input data indicative of a plurality of PWM modulation patterns with a respective plurality of duty-cycle values; and (5) controlling via the finite state machine selective access to the N sets of memory locations as a function of said PWM signal generation input data to load to the buffer circuit block PWM signal generation data from the memory locations selectively accessed, the PWM signal generation data in the buffer circuit block being indicative of i duty-cycle values for one of said N PWM modulation patterns.

Without prejudice to the underlying principles, the details and embodiments may vary, even significantly, with respect to what has been described by way of example only, without departing from the extent of protection.

What is claimed is:

1. A circuit, comprising:
    a plurality of memory locations configured to store pulse width modulation (PWM) signal generation data, wherein the plurality of memory locations are arranged in N sets of memory locations, wherein each of the N sets of memory locations comprises i channel memory locations, and wherein each of the i channel memory locations is configured to store a respective duty-cycle value, out of i duty-cycle values, for a respective one of N PWM modulation patterns;
    a selection circuit coupled to the plurality of memory locations, wherein the selection circuit is actuatable to selectively access a selected set of the N sets of memory locations;
    a buffer circuit coupled to an output of the selection circuit, wherein the buffer circuit is configured to store the PWM signal generation data from the i channel memory locations of the selected set; and
    a finite state machine configured to receive PWM signal generation input data indicative of a plurality of PWM modulation patterns with a respective plurality of duty-cycle values, wherein the finite state machine is coupled to the selection circuit and configured to activate the selection circuit as a function of the PWM signal generation input data to load the PWM signal generation data from the i channel memory locations of the selected set to the buffer circuit, the PWM signal generation data being indicative of i duty-cycle values for a PWM modulation pattern of the N PWM modulation patterns.

2. The circuit of claim 1, wherein the PWM signal generation data in the buffer circuit are arranged as a memory location matrix having a first number of rows and a second number of columns, wherein one of the first number of rows and the second number of columns is equal to a number i of the duty-cycle values and the other of the first number of rows and the second number of columns is equal to a number j, where j is a width of each of the duty-cycle values.

3. The circuit of claim 1, further comprising:
a further plurality of memory locations, wherein each of the further plurality of memory locations is coupled to one of the N sets of memory locations and is configured to store data indicative of a duration of a respective one of the N PWM modulation patterns.

4. The circuit of claim 3, wherein the finite state machine is responsive to the PWM signal generation input data comprising data indicative of respective durations for the N PWM modulation patterns.

5. The circuit of claim 3, further comprising a further selection circuit coupled to the further plurality of memory locations and the finite state machine, wherein the finite state machine is configured to activate the further selection circuit to select respective durations for the PWM signal generation data for the N PWM modulation patterns in the buffer circuit.

6. The circuit of claim 3, wherein the finite state machine is responsive to data indicative of the duration of a certain one of the N PWM modulation patterns being set to zero by skipping the certain one of the N PWM modulation patterns.

7. The circuit of claim 1, further comprising:
a pattern repetition storage location configured to store repetition data indicative of a number of repetitions of at least one of the N PWM modulation patterns, wherein the finite state machine is responsive to the repetition data by discontinuing repetition of the at least one of the N PWM modulation patterns as a result of an upper repetition threshold value being reached.

8. The circuit of claim 1, further comprising:
a shift storage location configured to store shift data indicative of a time shift value applicable between subsequent channels in the N PWM modulation patterns, wherein the finite state machine is responsive to the time shift value by providing a time shift between the PWM signal generation data for subsequent PWM modulation channels in the N PWM modulation patterns.

9. The circuit of claim 1, further comprising a plurality of PWM signal generators configured to generate PWM modulated signals as a function of the PWM signal generation data.

10. A device, comprising:
a pattern generation circuit, comprising:
a plurality of memory locations configured to store pulse width modulation (PWM) signal generation data, wherein the plurality of memory locations are arranged in N sets of memory locations, wherein each of the N sets of memory locations comprises i channel memory locations, and wherein each of the i channel memory locations are is configured to store a respective duty-cycle value, out of i duty-cycle values, for a respective one of N PWM modulation patterns;
a selection circuit coupled to the plurality of memory locations, wherein the selection circuit is actuatable to selectively access a selected set of the N sets of memory locations;
a buffer circuit coupled to an output of the selection circuit, wherein the buffer circuit is configured to store the PWM signal generation data from the i channel memory locations of the selected set;
a finite state machine configured to receive PWM signal generation input data indicative of a plurality of PWM modulation patterns with a respective plurality of duty-cycle values, wherein the finite state machine is coupled to the selection circuit and configured to activate the selection circuit as a function of the PWM signal generation input data to load the PWM signal generation data from the i channel memory locations of the selected set to the buffer circuit, the PWM signal generation data being indicative of i duty-cycle values for a PWM modulation pattern of the N PWM modulation patterns; and
a plurality of PWM signal generators configured to generate PWM modulated signals as a function of the PWM signal generation data; and
a user unit comprising a plurality of user channels coupled to the plurality of PWM generators, wherein the plurality of user channels is driven by the PWM modulated signals generated by the plurality of PWM signal generators.

11. The device of claim 10, wherein the user unit comprises a plurality of light emitting diodes arranged in the plurality of user channels.

12. The device of claim 10, further comprising a controller configured to provide the PWM signal generation input data to the finite state machine.

13. The device of claim 10, wherein the pattern generation circuit further comprises a further plurality of memory locations, wherein each of the further plurality of memory locations is coupled to one of the N sets of memory locations and is configured to store data indicative of a duration of a respective one of the N PWM modulation patterns.

14. The device of claim 10, wherein the pattern generation circuit further comprises a pattern repetition storage location configured to store repetition data indicative of a number of repetitions of at least one of the N PWM modulation patterns, wherein the finite state machine is responsive to the repetition data by discontinuing repetition of the at least one of the N PWM modulation patterns as a result of an upper repetition threshold value being reached.

15. The device of claim 10, wherein the pattern generation circuit further comprises a shift storage location configured to store shift data indicative of a time shift value applicable between subsequent channels in the N PWM modulation patterns, wherein the finite state machine is responsive to the time shift value by providing a time shift between the PWM signal generation data for subsequent PWM modulation channels in the N PWM modulation patterns.

16. The device of claim 10, wherein the PWM signal generation data in the buffer circuit are arranged as a memory location matrix having a first number of rows and a second number of columns, wherein one of the first number of rows and the second number of columns is equal to a number i of the duty-cycle values and the other of the first number of rows and the second number of columns is equal to a number j, where j is a width of each of the duty-cycle values.

17. A method, comprising:
providing a plurality of memory locations with pulse width modulation (PWM) signal generation data, wherein the plurality of memory locations are arranged in N sets of memory locations, wherein each of the N sets of memory locations comprises i channel memory locations;

loading each of the i channel memory locations with a respective duty cycle value, out of i duty-cycle values, for a respective one of N PWM modulation patterns, selectively accessing a selected set of the N sets of memory locations;

loading, to a buffer circuit, the PWM signal generation data from the i channel memory locations in the selected set;

receiving, at a finite state machine, PWM signal generation input data indicative of a plurality of PWM modulation patterns with a respective plurality of duty-cycle values; and controlling, via the finite state machine, selective access to the N sets of memory locations as a function of the PWM signal generation input data, the controlling comprising loading, to the buffer circuit, the PWM signal generation data from the i channel memory locations of the selected set, the PWM signal generation data being indicative of i duty-cycle values for a PWM modulation pattern of the N PWM modulation patterns.

18. The method of claim 17, further comprising storing data indicative of a duration of a respective one of the N PWM modulation patterns in a further plurality of memory locations, wherein each of the further plurality of memory locations is coupled to one of the N sets of memory locations.

19. The method of claim 17, further comprising storing repetition data indicative of a number of repetitions of at least one of the N PWM modulation patterns in a pattern repetition storage location, and discontinuing repetition of the at least one of the N PWM modulation patterns as a result of an upper repetition threshold value being reached by the repetition data.

20. The method of claim 17, further comprising storing shift data indicative of a time shift value applicable between subsequent channels in the N PWM modulation patterns in a shift storage location, and providing a time shift between the PWM signal generation data for subsequent PWM modulation channels in the N PWM modulation patterns in response to the time shift value.

* * * * *